US012577465B2

(12) United States Patent
Saito

(10) Patent No.: US 12,577,465 B2
(45) Date of Patent: Mar. 17, 2026

(54) METHOD FOR PRODUCING SEMICONDUCTOR TREATMENT LIQUID AND METHOD FOR PRODUCING SEMICONDUCTOR ELEMENT

(71) Applicant: TOKUYAMA CORPORATION, Yamaguchi (JP)

(72) Inventor: Kohei Saito, Yamaguchi (JP)

(73) Assignee: TOKUYAMA CORPORATION, Yamaguchi (JP)

(*) Notice: Subject to any disclaimer, the term of this patent is extended or adjusted under 35 U.S.C. 154(b) by 454 days.

(21) Appl. No.: 18/237,159

(22) Filed: Aug. 23, 2023

(65) Prior Publication Data

US 2024/0071782 A1     Feb. 29, 2024

(30) Foreign Application Priority Data

Aug. 26, 2022     (JP) ................................. 2022-135113
Dec. 20, 2022     (JP) ................................. 2022-203683

(51) Int. Cl.
| *C09K 13/04* | (2006.01) |
| *C08L 63/00* | (2006.01) |
| *H10P 50/60* | (2026.01) |
| *H10P 72/70* | (2026.01) |

(52) U.S. Cl.
CPC .............. *C09K 13/04* (2013.01); *C08L 63/00* (2013.01); *H10P 50/60* (2026.01); *H10P 72/7402* (2026.01); *H10P 72/7442* (2026.01)

(58) Field of Classification Search
CPC ..... C09K 13/04; C08L 63/00; H10P 72/7402; H10P 72/7442; H10P 50/60
USPC ................................................. 252/79.1–79.5
See application file for complete search history.

(56) References Cited

U.S. PATENT DOCUMENTS

| 6,962,628 B1 * | 11/2005 | Shibata .................. H05K 3/288 134/13 |
| 2008/0064223 A1 * | 3/2008 | Eguchi .................. C09K 13/04 216/99 |
| 2013/0115727 A1 * | 5/2013 | Park .......................... C23F 1/38 216/13 |
| 2018/0164683 A1 | 6/2018 | Fujiwara et al. |
| 2019/0308227 A1 | 10/2019 | Jo et al. |

FOREIGN PATENT DOCUMENTS

| JP | 2005-255899 A | 9/2005 | |
| JP | 2007-297641 A | 11/2007 | |
| WO | WO-2023210574 A1 * | 11/2023 | ................ C08J 7/02 |
| WO | WO-2024063107 A1 * | 3/2024 | ........... H01L 21/304 |

OTHER PUBLICATIONS

Saito, Kohei, WO-2024063107 A1, "Release agent, solvent for semiconductor, treatment liquid for semiconductor, release method, and semiconductor manufacturing method" English machine translation, Mar. 28, 2024 (Year: 2024).*
Smith, J.R. et al "Nitric-phosphoric acid treatment of TRU wastes" Osti.gov Technical Report, https://doi.org/10.2172/10116383, Sep. 30, 1993 (Year: 1993).*

* cited by examiner

*Primary Examiner* — Anita K Alanko
(74) *Attorney, Agent, or Firm* — Greenblum & Bernstein, P.L.C.

(57)     ABSTRACT

A method for producing a semiconductor treatment liquid used for treating a resin having an ether bond, the method comprising:

heating a phosphoric acid-containing solution to 100° C. or higher and 400° C. or lower to produce a heated solution;

cooling the heated solution to 5° C. or higher and 95° C. or lower to produce a cooled solution; and mixing the cooled solution with at least one selected from the group consisting of an aqueous hydrogen peroxide solution and an aqueous nitric acid solution.

8 Claims, No Drawings

METHOD FOR PRODUCING SEMICONDUCTOR TREATMENT LIQUID AND METHOD FOR PRODUCING SEMICONDUCTOR ELEMENT

TECHNICAL FIELD

The present invention relates to a method for producing a semiconductor treatment liquid used for treating a resin having an ether bond, and a method for producing a semiconductor element using the semiconductor treatment liquid.

BACKGROUND ART

In recent years, semiconductor elements have undergone advance in performance and higher integration. For semiconductors, various resins are used in various applications. As usage examples of resins in semiconductors, for example, epoxy resins, phenol resins, silicone resins, acrylic resins, and the like are used for semiconductor sealing, and epoxy resins, urethane resins, silicone resins, polyimide resins, and the like are used for conductive adhesives.

To form a semiconductor element using these resins, a step of processing and removing the resins after molding is required, but many of these resins have high chemical resistance, and thus, a technique for removing the resins from a semiconductor substrate has become more important. For example, an epoxy resin after thermal curing has a three-dimensional network structure and is excellent in chemical resistance. The chemical resistance of the epoxy resin varies mainly depending on a curing agent, and, as a representative curing agent, an amine or an acid anhydride is generally used for curing. It is conceivable that removal of these resins by a chemical method can be achieved by targeting a C—N bond in the case of an amine curing type and targeting an ester bond in the case of an acid anhydride curing type.

Patent Document 1 describes a treatment liquid for a carbon material/acid anhydride-cured epoxy resin composite material, which contains an alkali metal compound and a monoalcohol, and a separation method using the treatment liquid.

Patent Document 2 describes a method for treating a composite material of an inorganic substance and a cured epoxy resin, which contains a decomposition catalyst for a cured epoxy resin and an organic solvent.

RELATED ART DOCUMENT

Patent Document

Patent Document 1: JP 2005-255899 A
Patent Document 2: JP 2007-297641 A

SUMMARY OF THE INVENTION

Problems to be Solved by the Invention

Among epoxy resins, there is a type of an epoxy resin which is crosslinked by an acid, and has no bond having high chemical activity such as an ester bond, but has a widespread three-dimensional structure created by an ether bond. Patent Document 1 proposes a treatment liquid containing an alkali metal compound and a monoalcohol. The epoxy resin to be treated in the invention is an acid anhydride curing type epoxy resin, and its decomposition action is supposedly caused by transesterification and alcoholysis.

For this reason, it has been found through an investigation of the present inventor that a removal efficiency is greatly reduced in a case of an epoxy resin having an ether bond in which there is no crosslinking by an ester.

Patent Document 2 proposes a method for cleaving an ether bond by using a decomposition catalyst for a cured epoxy resin. In the invention, the cured epoxy resin to be treated preferably contains a halogen atom. Thus, it has been found that the removal efficiency is greatly reduced when the decomposition catalyst for a cured epoxy resin is used for a typical epoxy resin having an ether bond, but having no halogen atom substituting an ortho position of the benzene ring to which the ether group is bonded. In addition, in a semiconductor element, an epoxy resin may be used as an adhesive between silicon wafers. However, Si reacts and undergoes corrosion under basic conditions. And thus, it has found through an investigation of the present inventor that in a case where the treatment liquid described in Patent Document 2 is used, a Si substrate becomes rough depending on the decomposition catalyst for a cured epoxy resin to be used.

Accordingly, an object of the present invention is to provide a method for producing a semiconductor treatment liquid (hereinafter also referred to as a treatment liquid) capable of suppressing corrosion of Si of a substrate and ensuring a high peeling rate when removing a resin contained in a semiconductor wafer, particularly a resin having an ether bond, from the substrate, and a method for producing a semiconductor element using the semiconductor treatment liquid.

Means for Solving the Problems

The present inventor has conducted intensive studies to solve the above-described problems, and have found that a resin having an ether bond can be efficiently peeled off from a semiconductor substrate by using a treatment liquid produced by heating phosphoric acid and then mixing the phosphoric acid with at least one selected from the group consisting of an aqueous hydrogen peroxide solution and an aqueous nitric acid solution, thereby completing the present invention.

That is, the present invention is configured as follows.

Aspect 1. A method for producing a semiconductor treatment liquid used for treating a resin having an ether bond, the method including:

heating a phosphoric acid-containing solution to 100° C. or higher and 400° C. or lower to produce a heated solution;

cooling the heated solution to 5° C. or higher and 95° C. or lower to produce a cooled solution; and mixing the cooled solution with at least one selected from the group consisting of an aqueous hydrogen peroxide solution and an aqueous nitric acid solution.

Aspect 2. The method for producing a semiconductor treatment liquid according to Aspect 1, wherein a concentration of phosphoric acid in the phosphoric acid-containing solution is 0.1 mass % or greater and 95 mass % or less.

Aspect 3. The method for producing a semiconductor treatment liquid according to Aspect 1 or 2, wherein the heated solution contains pyrophosphoric acid.

Aspect 4. The method for producing a semiconductor treatment liquid according to any one of Aspects 1 to 3, wherein a concentration of water in the heated solution is 0 mass % or greater and 20 mass % or less.

Aspect 5. The method for producing a semiconductor treatment liquid according to any one of Aspects 1 to 4, wherein the resin having an ether bond is an epoxy resin.

Aspect 6. The method for producing a semiconductor treatment liquid according to any one of Aspects 1 to 5, wherein a concentration of hydrogen peroxide in the aqueous hydrogen peroxide solution is 0.001 mass % or greater and 90 mass % or less.

Aspect 7. The method for producing a semiconductor treatment liquid according to any one of Aspects 1 to 6, wherein a concentration of nitric acid in the aqueous nitric acid solution is 0.001 mass % or greater and 90 mass % or less.

Aspect 8. A method for producing a semiconductor element, the method including peeling a resin having an ether bond from a semiconductor substrate by using a semiconductor treatment liquid produced by the method for producing a semiconductor treatment liquid according to any one of Aspects 1 to 7, wherein the peeling is performed at 20° C. or higher and 400° C. or lower.

Effect of the Invention

According to the present invention, it is possible to produce a semiconductor treatment liquid capable of suppressing corrosion of Si of a substrate and ensuring a high peeling rate in treatment of a resin having an ether bond. Accordingly, the treatment liquid produced by the present production method can be suitably used for efficiently peeling a resin having an ether bond from a semiconductor substrate.

MODE FOR CARRYING OUT THE INVENTION

Hereinafter, the present invention will be described in detail. The following description is an example (representative example) of the present invention, and the present invention is not limited thereto. In addition, the present invention can be modified and implemented in any manner that does not depart from the gist of the present invention.

In the present specification, a numerical range expressed using "to" refers to a range including the numerical value before "to" as the lower limit and the numerical value after "to" as the upper limit.

Further, in the present specification, "concentration" means a content of each component with respect to a solution. Therefore, "concentration" can represent not only a content of a solute with respect to the solution, but also a content of solvent such as water contained with respect to the solution.

(Semiconductor Treatment Liquid)

In embodiments of the present invention, a semiconductor treatment liquid (hereinafter, also referred to as a treatment liquid) used for treating a resin having an ether bond refers to a chemical liquid for peeling a resin having an ether bond from a semiconductor substrate or a chemical liquid for dissolving a resin having an ether bond, and contains phosphoric acid and water, and further contains at least one selected from the group consisting of hydrogen peroxide and nitric acid. One embodiment of a method for producing these treatment liquids includes a heating step of heating a phosphoric acid-containing solution to produce a heated solution, a step of cooling the heated solution to produce a cooled solution, and a step of mixing the cooled solution with at least one selected from the group consisting of an aqueous hydrogen peroxide solution and an aqueous nitric acid solution. This embodiment is also referred to as a first embodiment.

In the present description, at least one selected from the group consisting of hydrogen peroxide and nitric acid is also referred to as "hydrogen peroxide and/or nitric acid", at least one selected from the group consisting of an aqueous hydrogen peroxide solution and an aqueous nitric acid solution is also referred to as an "aqueous hydrogen peroxide solution and/or aqueous nitric acid solution", and at least one selected from the group consisting of an active oxygen species and a nitrogen oxide is also referred to as an "active oxygen species and/or nitrogen oxide".

The present inventor has found that when a semiconductor substrate bonded to another member with a resin having an ether bond is treated with a treatment liquid containing phosphoric acid and water and further containing hydrogen peroxide and/or nitric acid, specifically, for example, when the treatment liquid and the resin having an ether bond are brought into contact with each other, the substrate is easily peeled off from the other member. Although the reason for this has a missing piece of the puzzle, it is conceivable that an active oxygen species and/or nitrogen oxide, which will be described below, and peroxyphosphoric acid are involved. It is presumed that the active oxygen species and/or nitrogen oxide and peroxyphosphoric acid act on an ether bond of the resin having an ether bond to cleave the ether bond, a phosphate group derived from phosphoric acid is bonded thereto, a three-dimensional structure of the resin having an ether bond is decomposed, and the resin is dissolved and mixed in the phosphoric acid. Accordingly, when the above-described treatment liquid is used, it is possible to suppress corrosion of Si of the substrate at the time of peeling and to ensure a high peeling rate.

Furthermore, the present inventor has studied a method for producing a treatment liquid, and has found that a treatment liquid can be efficiently produced not only by simply mixing the above-described three components but also by a process of heating a phosphoric acid-containing solution, a process of cooling the solution for efficient mixing with an aqueous hydrogen peroxide solution and/or an aqueous nitric acid solution to be mixed next, and a process of mixing the solution with the aqueous hydrogen peroxide solution and/or aqueous nitric acid solution.

(Phosphoric Acid)

A phosphoric acid-containing solution used in the production method of the present embodiment is a solution containing: an orthophosphoric acid represented by a chemical formula $H_3PO_4$; a polyphosphoric acid such as a pyrophosphoric acid ($H_4P_2O_7$) or a triphosphoric acid ($H_5P_3O_{10}$) produced by dehydration condensation of orthophosphoric acid; a metaphosphoric acid such as a trimetaphosphoric acid ($H_3P_3O_9$) or a highpolyphosphoric acid ($HPO_3$)$_{11}$; a peroxyphosphoric acid such as a peroxymonophosphoric acid ($H_3PO_5$) or a peroxydiphosphoric acid ($H_4P_2O_8$); salts of these phosphoric acids; ions of these phosphoric acids; diphosphorus pentaoxide ($P_2O_5$); tetraphosphorus decaoxide ($P_4O_{10}$); or the like, and is not particularly limited. However, from the perspective of a removal efficiency of the resin having an ether bond, a solution containing an orthophosphoric acid, a polyphosphoric acid such as pyrophosphoric acid, a peroxyphosphoric acid, diphosphorus pentaoxide, or tetraphosphous decaoxide is preferred. These phosphoric acids can be contained in a dissociated state. The phosphoric acid contained in the phosphoric acid-containing solution can be contained singly or in combination of two or more kinds thereof. For example, when a plurality of kinds of phosphoric acid such as an orthophosphoric acid and a pyrophosphoric acid are contained, the resin having an ether bond can be efficiently removed.

A concentration of the phosphoric acid in the phosphoric acid-containing solution used in the present embodiment can be any concentration as long as a part or all of the resin having an ether bond can be peeled off and removed from the substrate. The concentration of the phosphoric acid can be appropriately adjusted in consideration of a type, chemical resistance, an amount, a site, and a type of a functional group of a resin contained in a semiconductor element, resin characteristics such as a glass transition temperature, treatment conditions such as peeling, and the like. From the perspective of the removal efficiency of the resin having an ether bond, the concentration of the phosphoric acid is preferably 0.1 mass % or greater and 95 mass % or less, more preferably 20 mass % or greater and 95 mass % or less, even more preferably 30 mass % or greater and 95 mass % or less, and most preferably 50 mass % or greater and 90 mass % or less. When the concentration of the phosphoric acid is within the above range, the treatment liquid can be efficiently produced.

The phosphoric acid-containing solution used in the present embodiment can contain water. However, when a content of water increases, a temperature rising efficiency of the treatment liquid decreases, and thus, the concentration of water in the phosphoric acid-containing solution is preferably 5 mass % or greater and 99.9 mass % or less, more preferably 5 mass % or greater and 80 mass % or less, even more preferably 5 mass % or greater and 70 mass % or less, and most preferably 10 mass % or greater and 50 mass % or less, from the perspective of an economic efficiency and viscosity. When the concentration of water is within the above range, the treatment liquid can be efficiently produced.

The phosphoric acid-containing solution used for producing the treatment liquid is preferably a phosphoric acid-containing solution from which metal ions, organic impurities, and/or particles have been removed by distillation, ion exchange, filtration, various types of adsorption, various types of purification, or the like.

(Step of Heating Phosphoric Acid-Containing Solution)

The production method according to the present embodiment includes a step of heating the phosphoric acid-containing solution to produce a heated solution (hereinafter also referred to as a heating step).

A heating temperature in the heating step can be any temperature as long as water in the phosphoric acid-containing solution can be removed or a condensed phosphoric acid such as pyrophosphoric acid can be partially produced, and the heating temperature can be appropriately adjusted in consideration of a concentration, a type, and an amount of the phosphoric acid, a treatment time, and the like. Specifically, the heating temperature is preferably 100° C. or higher and 400° C. or lower, more preferably 100° C. or higher and 350° C. or lower, even more preferably 100° C. or higher and 300° C. or lower, and particularly preferably 120° C. or higher and 250° C. or lower from the perspective of the removal efficiency of water in the phosphoric acid-containing solution, and most preferably 150° C. or higher and 250° C. or lower from the perspective of safety in handling. When the heating temperature is within the above range, the treatment liquid can be efficiently produced.

A heating time in the heating step can be any period of time as long as water in the phosphoric acid-containing solution can be removed or a condensed phosphoric acid such as pyrophosphoric acid can be partially produced, and the heating time can be appropriately adjusted in consideration of a concentration, a type, an amount of the phosphoric acid, a treatment temperature, and the like. The heating time is preferably 0.01 hours or more and 100 hours or less, more preferably 0.1 hours or more and 50 hours or less, and even more preferably 0.1 hours or more and 30 hours or less from the perspective of the removal efficiency of water in the phosphoric acid-containing solution, and most preferably 0.1 hours or more and 20 hours or less from the perspective of an economic efficiency. When the heating time is within the above range, water in the phosphoric acid-containing solution can be efficiently removed, and a condensed phosphoric acid such as pyrophosphoric acid can be efficiently produced.

An atmosphere of heating treatment in the heating step is not particularly limited and can be in the air or in an inert gas such as nitrogen or argon. The heating treatment can be performed under normal pressure, reduced pressure, or increased pressure. From the perspective of safety during the treatment, the treatment is preferably performed under normal pressure, or from the perspective of the removal efficiency of water, the treatment is preferably carried out under reduced pressure.

In the heating step, a facility or a container in which the heating treatment is carried out is not particularly limited, and a known method can be employed. However, for avoiding mixing of water volatilized in the heating step, it is preferable to perform the treatment in an open system.

As a material for the container, a container having a surface in contact with the treatment liquid, the surface being formed of a resin or glass, is preferably used to prevent particles and an amount of metal from increasing. Examples of such a resin include vinyl chloride-based resins (soft or hard vinyl chloride resins), nylon-based resins, silicone-based resins, polyolefin-based resins (polyethylene and polypropylene), and fluorine-based resins. Among these, in view of ease of molding, chemical resistance, and low impurity dissolution, a fluorine-based resin is more preferred. Such a fluorine-based resin is not particularly limited as long as it is a resin containing a fluorine atom, and a known fluorine-based resin can be used. Examples thereof include poly(tetrafluoroethylene), poly(chlorotrifluoroethylene), poly(vinylidene fluoride), tetrafluoroethylene-hexafluoropropylene copolymers, tetrafluoroethylene-perfluoroalkyl vinyl ether copolymers, tetrafluoroethylene-ethylene copolymers, chlorotrifluoroethylene-ethylene copolymers, and cyclic polymers of perfluoro(butenyl vinyl ether). Among these, it is particularly preferable to use a tetrafluoroethylene-perfluoroalkyl vinyl ether copolymer in consideration of availability of the container itself, productivity, and the like. As needed, the heating treatment can be carried out in a light-shielded facility.

As another embodiment of the present invention, instead of the heating step, a step of removing water in the phosphoric acid-containing solution by a treatment different from the heating treatment can be included. Examples of such a method include a method in which a dehydrating agent such as sulfuric acid or calcium chloride is added to the phosphoric acid-containing solution, and a method in which a solid such as $P_2O_5$ or $P_{10}O_4$ is added to the phosphoric acid-containing solution for hydrolysis. Alternatively, these methods can be performed in combination with the heating step in the above-described embodiment. When these methods are performed together with the heating step, the water in the phosphoric acid-containing solution may be capable of being removed with good reproducibility.

(Post-Heating Phosphoric Acid)

The heated solution containing phosphoric acid produced in the heating step (hereinafter referred to as post-heating phosphoric acid) is a solution containing: orthophosphoric acid; polyphosphoric acid such as pyrophosphoric acid or triphosphoric acid; metaphosphoric acid such as trimetaphosphoric acid or highpolyphosphoric acid; peroxyphosphoric acid such as peroxymonophosphoric acid or peroxydiphosphoric acid; salts of these phosphoric acids; ions of these phosphoric acids; diphosphorus pentoxide; or tetraphosphorus decaoxide ($P_4O_{10}$), and is not particularly limited. However, from the perspective of the removal efficiency of the resin having an ether bond, a solution containing orthophosphoric acid, polyphosphoric acid such as pyrophosphoric acid, peroxyphosphoric acid, diphosphorus pentaoxide, or tetraphosphorous decaoxide is preferred. The post-heating phosphoric acid contained in the heated solution can be dissociated.

The heated solution containing a condensed phosphoric acid such as pyrophosphoric acid makes peroxyphosphoric acid be easily generated when the heated solution is mixed with an aqueous hydrogen peroxide solution and/or an aqueous nitric acid solution later. As a result, it is conceivable that active oxygen species and/or nitrogen oxide is easily generated, and it is presumed that the action of cleaving the ether bond is strengthened, and thus the peeling effect can be improved.

Polyphosphoric acid such as pyrophosphoric acid is also a substance produced by dehydration reaction of orthophosphoric acid by heating. Accordingly, in a case where the phosphoric acid contained in the phosphoric acid-containing solution is orthophosphoric acid, a part thereof can be changed to polyphosphoric acid such as pyrophosphoric acid by the heating treatment in the heating step.

A concentration of the condensed phosphoric acid such as pyrophosphoric acid in the heated solution is not particularly limited, and in a case where the condensed phosphoric acid is present, the condensed phosphoric acid is preferably present at a concentration at which the condensed phosphoric acid can be formed under the conditions of the heating step in this section.

The heated solution can contain water derived from water contained in phosphoric acid as a raw material to be used, or the like. However, when the content of water increases, a temperature rising efficiency of the treatment liquid decreases, and thus, the concentration of water in the heated solution is preferably 0 mass % or greater and 20 mass % or less, more preferably 0 mass % or greater and 15 mass % or less, and even more preferably 0 mass % or greater and 12 mass % or less, and from the perspective of economic efficiency and viscosity, 0.01 mass % or greater and 10 mass % or less is most preferred. When the concentration of water is within the above range, the treatment liquid can be efficiently produced.

(Step of Cooling Heated Solution)

The production method according to the present embodiment includes a step of cooling the heated solution (hereinafter, also referred to as a cooling step). A temperature of a liquid (cooled solution) after cooling treatment in the cooling step can be any temperature as long as the aqueous hydrogen peroxide solution and/or the aqueous nitric acid solution can be safely mixed, and the temperature can be appropriately adjusted in consideration of an amount, a concentration, an impurity content of the aqueous hydrogen peroxide solution and/or the aqueous nitric acid solution to be mixed, the amount of the heated solution, and the like. The temperature of the cooled solution is preferably 5° C. or higher and 95° C. or lower, more preferably 7° C. or higher and 95° C. or lower, and even more preferably 10° C. or higher and 95° C. or lower from the perspective of the cooling efficiency of the liquid, and most preferably 10° C. or higher and 90° C. or lower from the perspective of safety in handling. When the temperature of the cooled solution is within the above range, the treatment liquid can be efficiently produced.

A cooling time in the cooling step can be any period of time as long as the temperature of the heated solution can be sufficiently cooled, and the cooling time can be appropriately adjusted in consideration of the concentration and type of the post-heating phosphoric acid, the amount of the heated solution, the treatment temperature, and the like. The cooling time is preferably 0.01 hours or more and 100 hours or less, more preferably 0.1 hours or more and 50 hours or less, and even more preferably 0.1 hours or more and 30 hours or less from the perspective of the cooling efficiency of the post-heating phosphoric acid, and most preferably 0.1 hours or more and 20 hours or less from the perspective of the economic efficiency. When the cooling time is within the above range, the treatment liquid can be efficiently produced.

An atmosphere of the cooling treatment in the cooling step is not particularly limited, and can be in the air or in an inert gas such as nitrogen or argon. The cooling treatment can be carried out under normal pressure, reduced pressure, or increased pressure. From the perspective of safety during the treatment, the treatment is preferably carried out under normal pressure.

In the cooling step, a facility or a container in which the cooling treatment is performed is not particularly limited, a known method can be employed, and cooling can also be performed by natural cooling (natural standing). As a material for the container, a container having a surface in contact with the treatment liquid, the surface being formed of a resin or glass, is preferably used to prevent particles and an amount of metal from increasing. Examples of such a resin include vinyl chloride-based resins (soft or hard vinyl chloride resins), nylon-based resins, silicone-based resins, polyolefin-based resins (polyethylene and polypropylene), and fluorine-based resins. Among these, in view of ease of molding, chemical resistance, and low impurity dissolution, a fluorine-based resin is more preferred. Such a fluorine-based resin is not particularly limited as long as it is a resin containing a fluorine atom, and a known fluorine-based resin can be used. Examples thereof include poly(tetrafluoroethylene), poly(chlorotrifluoroethylene), poly(vinylidene fluoride), tetrafluoroethylene-hexafluoropropylene copolymers, tetrafluoroethylene-perfluoroalkyl vinyl ether copolymers, tetrafluoroethylene-ethylene copolymers, chlorotrifluoroethylene-ethylene copolymers, and cyclic polymers of perfluoro(butenyl vinyl ether). Among these, it is particularly preferable to use a tetrafluoroethylene-perfluoroalkyl vinyl ether copolymer in consideration of availability of the container itself, productivity, and the like. As needed, the cooling treatment can be carried out in a light-shielded facility.

(Post-Cooling Phosphoric Acid)

The cooled solution containing phosphoric acid produced in the cooling step (hereinafter, also referred to as post-cooling phosphoric acid) is a solution containing: orthophosphoric acid; polyphosphoric acid such as pyrophosphoric acid or triphosphoric acid; metaphosphoric acid such as trimetaphosphoric acid or highpolyphosphoric acid; peroxyphosphoric acid such as peroxymonophosphoric acid or peroxydiphosphoric acid; salts of these phosphoric acids;

ions of these phosphoric acids; diphosphorus pentoxide; or tetraphosphorus decaoxide ($P_4O_{10}$), and is not particularly limited. However, from the perspective of the removal efficiency of the resin having an ether bond, a solution containing orthophosphoric acid, polyphosphoric acid such as pyrophosphoric acid, peroxyphosphoric acid, diphosphorus pentaoxide, or tetraphosphorous decaoxide is preferred. The post-cooling phosphoric acid contained in the cooled solution can be dissociated.

(Step of Mixing Aqueous Hydrogen Peroxide Solution and/ or Aqueous Nitric Acid Solution)

The production method according to the present embodiment includes a step of mixing the cooled solution of the phosphoric acid-containing solution with an aqueous hydrogen peroxide solution and/or an aqueous nitric acid solution to produce a mixed liquid (hereinafter, also referred to as a mixing step). This mixed liquid can be treated as the treatment liquid. A mixing method in the mixing step is not particularly limited as long as the cooled solution is brought into contact with the aqueous hydrogen peroxide solution and/or the aqueous nitric acid solution. As an example, the aqueous hydrogen peroxide solution and/or the aqueous nitric acid solution can be added to the cooled solution, or the cooled solution can be added to the aqueous hydrogen peroxide solution and/or the aqueous nitric acid solution. As needed, stirring, heating, and the like can be performed.

A temperature of mixing treatment in the mixing step can be any temperature as long as the aqueous hydrogen peroxide solution and/or the aqueous nitric acid solution can be safely mixed, and the temperature can be appropriately adjusted in consideration of an amount, a concentration, and an impurity content of the aqueous hydrogen peroxide solution and/or the aqueous nitric acid solution to be mixed, an amount and a temperature of the cooled solution, and the like. This temperature is preferably 0.1° C. or higher and 200° C. or lower, more preferably 1° C. or higher and 150° C. or lower, and even more preferably 3° C. or higher and 120° C. or lower from the perspective of being capable of performing the mixing step at a temperature close to that in the cooling step, and most preferably 5° C. or higher and 100° C. or lower from the perspective of safety in handling. When the temperature is within the above range, the treatment liquid can be efficiently produced.

An atmosphere of the mixing treatment in the mixing step is not particularly limited, and can be in the air or in an inert gas such as nitrogen or argon. The mixing treatment can be carried out under normal pressure, reduced pressure, or increased pressure. From the perspective of safety during the treatment, the treatment is preferably carried out under normal pressure.

A facility or a container in which mixing in the mixing step is performed is not particularly limited, and a known method can be employed. As a material for the container, a container having a surface in contact with the treatment liquid, the surface being formed of a resin or glass, is preferably used to prevent particles and an amount of metal from increasing. Examples of such a resin include vinyl chloride-based resins (soft or hard vinyl chloride resins), nylon-based resins, silicone-based resins, polyolefin-based resins (polyethylene and polypropylene), and fluorine-based resins. Among these, in view of ease of molding, chemical resistance, and low impurity dissolution, a fluorine-based resin is more preferred. Such a fluorine-based resin is not particularly limited as long as it is a resin containing a fluorine atom, and a known fluorine-based resin can be used. Examples thereof include poly(tetrafluoroethylene), poly (chlorotrifluoroethylene), poly(vinylidene fluoride), tetrafluoroethylene-hexafluoropropylene copolymers, tetrafluoroethylene-perfluoroalkyl vinyl ether copolymers, tetrafluoroethylene-ethylene copolymers, chlorotrifluoroethylene-ethylene copolymers, and cyclic polymers of perfluoro(butenyl vinyl ether). Among these, it is particularly preferable to use a tetrafluoroethylene-perfluoroalkyl vinyl ether copolymer in consideration of availability of the container itself, productivity, and the like. As needed, the mixing treatment can be carried out in a light-shielded facility.

(Aqueous Hydrogen Peroxide Solution)

A concentration of hydrogen peroxide in the aqueous hydrogen peroxide solution that can be used in the production method according to the present embodiment can be in any concentration range as long as a part or all of the resin having an ether bond can be peeled off and removed from the substrate, and the concentration can be appropriately adjusted in consideration of a type, an amount, a site, and a type of a functional group of the resin contained in a semiconductor element, peeling efficiency, safety in handling, or the like. The concentration of hydrogen peroxide is preferably 0.001 mass % or greater and 90 mass % or less, more preferably 1 mass % or greater and 70 mass % or less, and even more preferably 10 mass % or greater and 50 mass % or less from the perspective of the removal efficiency of the resin having an ether bond, and most preferably 20 mass % or greater and 50 mass % or less from the perspective of economic efficiency and safety in handling. When the concentration of hydrogen peroxide is within the above range, the treatment liquid can be efficiently produced.

In the mixed liquid (treatment liquid) of the cooled solution of the phosphoric acid-containing solution and the aqueous hydrogen peroxide solution, a concentration of hydrogen peroxide in the mixed liquid is not particularly limited, but from the perspective of the removal efficiency of the resin having an ether bond, the concentration of hydrogen peroxide is preferably 0.001 mass % or greater and 50 mass % or less, more preferably 0.01 mass % or greater and 30 mass % or less, even more preferably 0.1 mass % or greater and 20 mass % or less, and particularly preferably 0.3 mass % or greater and 15 mass % or less.

In addition, in the mixed liquid (treatment liquid) of the cooled solution of the phosphoric acid-containing solution and the aqueous hydrogen peroxide solution, a ratio of water to hydrogen peroxide (water/hydrogen peroxide) is, on the mass basis, preferably 0.00001 or greater and 9.000 or less, more preferably 0.0001 or greater and 2.540 or less, and even more preferably 0.001 or greater and 1.050 or less, and from the perspective of economic efficiency and safety in handling, most preferably 0.010 or greater and 0.400 or less. When the concentration and ratio are within the above range, the resin having an ether bond can be efficiently removed.

(Aqueous Nitric Acid Solution)

A concentration of nitric acid in the aqueous nitric acid solution that can be used in the production method according to the present embodiment can be in any concentration range as long as a part or all of the resin having an ether bond can be peeled off and removed from the substrate, and the concentration of nitric acid can be appropriately adjusted in consideration of a type, an amount, a site, and a type of a functional group of the resin contained in a semiconductor element, peeling efficiency, safety in handling, and the like. The concentration of nitric acid is preferably 0.001 mass % or greater and 90 mass % or less, more preferably 1 mass % or greater and 90 mass % or less, and even more preferably 10 mass % or greater and 90 mass % or less from the perspective of the removal efficiency of the resin having an ether bond, and most preferably 20 mass % or greater and 80 mass % or less from the perspective of economic efficiency and safety in handling. When the concentration of nitric acid is within the above range, the treatment liquid can be efficiently produced.

In the mixed liquid (treatment liquid) of the cooled solution of the phosphoric acid-containing solution and the aqueous nitric acid solution, a concentration of nitric acid in the mixed liquid is not particularly limited, but from the perspective of the removal efficiency of the resin having an ether bond, the concentration of nitric acid is more preferably 0.001 mass % or greater and 50 mass % or less, even more preferably 0.01 mass % or greater and 30 mass % or less, particularly preferably 0.1 mass % or greater and 20 mass % or less, and further particularly preferably 0.3 mass % or greater and 15 mass % or less.

In addition, in the mixed liquid (treatment liquid) of the cooled solution of the phosphoric acid-containing solution and the aqueous nitric acid solution, a ratio of water to nitric acid (water/nitric acid) is, on the mass basis, preferably 0.0001 or greater and 5.000 or less, more preferably 0.001 or greater and 2.500 or less, and even more preferably 0.010 or greater and 2.250 or less, and from the perspective of economic efficiency and safety in handling, most preferably 0.100 or greater and 1.500 or less. When the concentration and ratio are within the above range, the resin having an ether bond can be efficiently removed.

(Activator)

An activator for activating hydrogen peroxide and/or nitric acid can be added to the treatment liquid. When the activator is added, hydrogen peroxide and/or nitric acid may be activated to increase a rate at which an object is peeled off from the substrate. Alternatively, when hydrogen peroxide and/or nitric acid reacts with the activator, a new chemical species is generated in the system, and the rate of peeling the object from the substrate may be increased.

As an activator of hydrogen peroxide, an activator such as acid or a radical generator can be used. Examples of such an acid include sulfuric acid, methanesulfonic acid, ethanesulfonic acid, p-toluenesulfonic acid, p-phenolsulfonic acid, benzenesulfonic acid, nitric acid, nitrous acid, formic acid, acetic acid, propionic acid, butyric acid, benzoic acid, vanadic acid, tungstic acid, molybdic acid, chromic acid, osmium tetroxide, and selenium dioxide. Examples of the radical generator include urea and amine.

When such an activator is contained, a peracid (including a peroxyacid), a radical, a peroxide, or an active oxygen species is generated in the treatment liquid of the present embodiment, and the rate of peeling the object from the substrate may be increased.

On the other hand, Fenton's reagent can be exemplified as an example of the activator for hydrogen peroxide, but in a case where this Fenton's reagent remains on a semiconductor wafer as will be described below, it causes a decrease in yield of semiconductor elements and the like. Examples of such a Fenton's reagent include iron ions, copper ions, and silver ions.

As an activator for nitric acid, an activator such as acid or hydrogen peroxide can be used. Examples of such an acid include sulfuric acid, hydrobromic acid, acetic anhydride, trifluoroacetic acid, methanesulfonic acid, ethanesulfonic acid, o-toluenesulfonic acid, p-toluenesulfonic acid, p-phenolsulfonic acid, benzenesulfonic acid, m-nitrobenzenesulfonic acid, and trifluoromethanesulfonic acid.

When such an activator is contained, a peracid (including a peroxyacid), a radical, or a nitrogen oxide is generated in the treatment liquid of the present embodiment, and the rate of peeling the object from the substrate may be increased.

Other additives that have been typically used in semiconductor treatment liquids can be added to the treatment liquid produced by the production method described above, as desired, in a range that does not impair the object of the present invention. Examples of the other additives include a metal corrosion inhibitor, an organic solvent, a catalyst, a complexing agent, a chelating agent, a surfactant, an antifoaming agent, a pH adjusting agent, a stabilizer, a solubilizer, and a precipitation inhibitor. The additive can be added alone, or a plurality of the additives can be added in combination.

(Stabilizer)

A stabilizer can be added to the treatment liquid to suppress decomposition of hydrogen peroxide. Examples of such a stabilizer include amide-based compounds such as uric acid, barbituric acids, hippuric acid, cyanuric acid, acetanilide; alkali metal carbonates; and alkali metal hydrogen carbonates.

The treatment liquid according to the present embodiment can contain a phosphoric acid-related substance or the like, which is derived from the phosphoric acid or contained for the convenience of production of the treatment liquid. Examples of such a phosphoric acid-related substance include phosphate esters, phosphine, phosphorous acid, phosphonic acid, hypophosphorous acid, and phosphinic acid. Examples of the phosphate esters include phosphate monoesters such as phenyl dihydrogen phosphate, benzyl dihydrogen phosphate, ethyl dihydrogen phosphate, and methyl dihydrogen phosphate; phosphate diesters such as diphenyl phosphate, dibenzyl phosphate, diethyl phosphate, and dimethyl phosphate; and phosphate triesters such as triphenyl phosphate, tribenzyl phosphate, triethyl phosphate, and trimethyl phosphate.

The treatment liquid can contain an alkali metal ion, an alkaline earth metal ion, or the like, which is derived from the phosphoric acid, hydrogen peroxide, nitric acid, additive, or the like, or contained for the convenience of production of the treatment liquid. However, in a case where the alkali metal ion, the alkaline earth metal ion, or the like remains on a semiconductor wafer, it causes a decrease in yield of semiconductor elements and the like.

In addition, when a metal ion such as chromium, manganese, iron, cobalt, copper, molybdenum, or tungsten is contained in the treatment liquid, decomposition of hydrogen peroxide, or the like may be caused. Alternatively, these metal ions may be oxidized by nitric acid to become a particle source. Accordingly, as a content of metals in the treatment liquid, specifically, a content of any one metal selected from the group consisting of lithium, sodium, potassium, aluminum, magnesium, calcium, chromium, manganese, iron, nickel, cobalt, copper, silver, cadmium, barium, tin, zinc, molybdenum, tungsten, and lead is, on the mass basis, preferably 1 ppb or less, more preferably 0.5 ppb or less, even more preferably 0.2 ppb or less, and most preferably 0.1 ppb or less.

In addition, among the metals, any one metal selected from the group consisting of iron, copper, manganese, chromium, and zinc is, on the mass basis, preferably 0.01 ppt or greater and 1 ppb or less, more preferably 0.01 ppt or greater and 0.5 ppb or less, even more preferably 0.01 ppt or greater and 0.2 ppb or less, and most preferably 0.01 ppt or greater and 0.1 ppb or less.

Furthermore, in the description above, ionic metals are listed as examples for a metal that can be contained in the treatment liquid; however, the metal is not limited to these, and a non-ionic metal (particulate metal) can be contained, preferably in a concentration within the above range.

The treatment liquid can contain a gas such as hydrogen or oxygen for convenience in production of the treatment liquid or the like.

The treatment liquid can contain an active oxygen species and/or nitrogen oxide, or a peroxyacid such as peroxyphosphoric acid derived from the phosphoric acid and the aqueous hydrogen peroxide solution and/or the aqueous nitric acid solution, or the like, or for convenience in production of the treatment liquid or the like. Examples of such an active oxygen species include: nucleophilic chemical species such as perhydroxy anion ($O_2H^-$) and peroxide anion ($\cdot O_2{}^{2-}$); electrophilic chemical species such as hydroxonium cation ($OH^+$); radicals such as perhydroxy radical ($\cdot HO_2$), hydroxy radical ($\cdot OH$), and superoxide anion radical ($\cdot O_2{}^-$); and singlet oxygen. Examples of such a nitrogen oxide include a nitrosonium ion ($NO^+$), a nitronium ion ($NO_2{}^+$), a nitrate ion ($NO_3{}^-$), a nitrite ion ($NO_2{}^-$), a subnitrite ion ($NO^-$), nitrogen dioxide ($NO_2$), dinitrogen trioxide ($N_2O_3$), dinitrogen tetroxide ($N_2O_4$), and dinitrogen pentoxide ($N_2O_5$).

The concentration of the phosphoric acid in the mixed liquid is not particularly limited, but is preferably 20 mass % or greater and 99 mass % or less, more preferably 40 mass % or greater and 97 mass % or less, even more preferably 60 mass % or greater and 97 mass % or less, and particularly preferably 70 mass % or greater and 97 mass % or less, from the perspective of the removal efficiency of the resin having an ether bond.

The concentration of water in the mixed liquid is not particularly limited, but from the viewpoint of the removal efficiency of the resin having an ether bond, the concentration thereof is preferably 0.2 mass % or greater and 60 mass % or less, more preferably 0.2 mass % or greater and 40 mass % or less, even more preferably 0.2 mass % or greater and 30 mass % or less, and particularly preferably 0.2 mass % or greater and 23 mass % or less.

(Second Embodiment of Method for Producing Semiconductor Treatment Liquid)

Another embodiment of a method for producing a semiconductor treatment liquid includes a step of mixing a phosphoric acid-containing solution with an aqueous hydrogen peroxide solution and/or an aqueous nitric acid solution, and a step of heating the mixed liquid. Hereinafter, this embodiment is also referred to as a second embodiment. With this method as well, it is possible to produce a treatment liquid containing phosphoric acid and water and further containing hydrogen peroxide and/or nitric acid. In a case of using hydrogen peroxide, hydrogen peroxide is decomposed at a high temperature although depending on a concentration thereof, and thus the heating temperature is limited to a temperature range in which hydrogen peroxide can be present in the mixed liquid. On the other hand, in the first embodiment, the heating treatment is performed before mixing with the aqueous hydrogen peroxide solution, and thus such a limitation is not imposed. Also, in a case of using nitric acid, nitric acid has a boiling point lower than that of water, or nitric acid forms an azeotropic compound with respect to water depending on a concentration thereof, and thus water cannot be removed by heating. From these perspectives, the treatment liquid can be produced more efficiently in the first embodiment than in the second embodiment.

The same materials as those described in the first embodiment can be used as materials for the phosphoric acid-containing solution, the aqueous hydrogen peroxide solution, the aqueous nitric acid solution, and the like used in the second embodiment.

(Step of Mixing Phosphoric Acid-Containing Solution with Aqueous Hydrogen Peroxide Solution and/or Aqueous Nitric Acid Solution)

The production method according to the second embodiment includes a step of mixing a phosphoric acid-containing solution with an aqueous hydrogen peroxide solution and/or an aqueous nitric acid solution to produce a mixed liquid (hereinafter also referred to as a mixing step according to the second embodiment).

A mixing method in the mixing step according to the second embodiment is not particularly limited as long as phosphoric acid in the phosphoric acid-containing solution is brought into contact with the aqueous hydrogen peroxide solution and/or the aqueous nitric acid solution. As an example, the aqueous hydrogen peroxide solution and/or the aqueous nitric acid solution can be added to the phosphoric acid-containing solution, or the phosphoric acid-containing solution can be added to the aqueous hydrogen peroxide solution and/or the aqueous nitric acid solution. As needed, stirring, heating, and the like can be performed.

A concentration of the phosphoric acid in the mixed liquid is preferably 10 mass % or greater and 99 mass % or less, more preferably 20 mass % or greater and 99 mass % or less, even more preferably 30 mass % or greater and 97 mass % or less, and particularly preferably 40 mass % or greater and 97 mass % or less, from the perspective of the removal efficiency of the resin having an ether bond.

In a case of using hydrogen peroxide, a concentration of the hydrogen peroxide in the mixed liquid is preferably 0.001 mass % or greater and 70 mass % or less, more preferably 0.001 mass % or greater and 50 mass % or less, even more preferably 0.01 mass % or greater and 30 mass % or less, and particularly preferably 0.3 mass % or greater and 15 mass % or less, from the perspective of the removal efficiency of the resin having an ether bond.

In a case of using nitric acid, a concentration of the nitric acid in the mixed liquid is preferably 0.001 mass % or greater and 70 mass % or less, more preferably 0.001 mass % or greater and 50 mass % or less, even more preferably 0.01 mass % or greater and 30 mass % or less, and particularly preferably 0.1 mass % or greater and 15 mass % or less, from the perspective of the removal efficiency of the resin having an ether bond.

A concentration of water in the mixed liquid is preferably 0.1 mass % or greater and 90 mass % or less, more preferably 0.1 mass % or greater and 70 mass % or less, even more preferably 0.1 mass % or greater and 45 mass % or less, and particularly preferably 0.2 mass % or greater and 30 mass % or less, from the viewpoint of the removal efficiency of the resin having an ether bond.

As conditions of the mixing step according to the second embodiment other than the above-described conditions, the conditions in the mixing step in the above-described first embodiment can be similarly applied.

(Step of Heating Mixed Liquid)

The production method according to the second embodiment includes a step of heating a mixed liquid produced in the mixing step according to the second embodiment to produce a heated solution (hereinafter also referred to as a heating step according to the second embodiment).

A heating temperature in the heating step according to the second embodiment can be any temperature as long as water in the phosphoric acid-containing solution can be removed or condensed phosphoric acid such as pyrophosphoric acid can be partially generated, and the heating temperature can be appropriately adjusted in consideration of a concentration, a type, and an amount of phosphoric acid, a treatment time, a decomposition temperature of hydrogen peroxide, a boiling point of nitric acid, or the like. Specifically, the heating temperature is preferably 20° C. or higher and 400° C. or lower, more preferably 50° C. or higher and 250° C. or lower, even more preferably 60° C. or higher and 250° C. or lower, and particularly preferably 80° C. or higher and 200° C. or lower, from the perspective of the removal efficiency of water from the phosphoric acid-containing solution, and most preferably 80° C. or higher and 150° C. or lower from the perspective of safety in handling. When the heating temperature is within the above range, the treatment liquid can be efficiently produced.

As conditions of the heating step according to the second embodiment other than the above-described conditions, the conditions in the heating step in the above-described first embodiment can be similarly applied.

As the conditions of the solution produced in the heating step, the same conditions as those of the mixed liquid produced in the first embodiment can be applied.

(Other Steps)

The production method according to the second embodiment can include a step other than the mixing step and the heating step according to the second embodiment described above, and examples thereof include a cooling step of cooling the heated solution produced in the heating step according to the second embodiment. In this cooling step, the same conditions as in the cooling step according to the first embodiment can be applied.

(Method for Producing Semiconductor Element)

Another embodiment of the present invention is a method for producing a semiconductor element. Hereinafter, a method for producing a semiconductor element will be described.

In the above-described treatment liquid, hydrogen peroxide and/or nitric acid acts as a catalyst in the phosphoric acid to cleave an ether bond of the resin having an ether bond, which makes the treatment liquid possible to peel and dissolve the resin. Accordingly, the above-described treatment liquid can be suitably used in a resin processing step, a resin peeling step, a resin removing step, a residue removing step, a cleaning step, and the like in a semiconductor production process.

One aspect of the method for producing a semiconductor element according to the present embodiment includes the heating step, the cooling step, and the mixing step described above. The above-described treatment liquid can be used as it is in the method for producing a semiconductor element. Depending on the situation, as another embodiment, in a case where the concentration of the aqueous hydrogen peroxide solution and/or the aqueous nitric acid solution to be mixed after the heating step is sufficiently low, the mixing step can be performed without performing the cooling step, and this embodiment can be used in the semiconductor production step. Note that the method for producing a semiconductor element can include a known step used in a method for producing a semiconductor element, such as one or more steps selected from a wafer fabrication step, an oxide film formation step, a transistor formation step, a wiring formation step, and a CMP step.

(Reuse of Treatment Liquid)

After a semiconductor element is produced using the treatment liquid of the present embodiment, the used liquid can be reused. Here, the used liquid is, for example, a treatment liquid which has been used at least once in a process such as a resin removing step in producing a semiconductor wafer, for example. In the reuse of the used liquid, the used liquid can be circulated for reuse, hydrogen peroxide and/or nitric acid can be newly added to the used liquid for reuse, or phosphoric acid in the used liquid can be concentrated to reduce water for reuse.

As one aspect of the method for producing a semiconductor element according to the present embodiment, an aspect in which the above-described treatment liquid is used in the resin peeling step will be described. The method for producing a semiconductor element according to this aspect includes a step of using the treatment liquid produced by the above-described production method to peel a resin having an ether bond from a semiconductor substrate (hereinafter, also referred to as a peeling step).

The peeling step refers to peeling a part or all of the resin having an ether bond from the semiconductor substrate using the treatment liquid. This peeling step includes, for example, an aspect in which an adhesive layer between the semiconductor substrate and the resin is peeled off, or an aspect in which the resin is partially peeled off from the resin layer. In addition, the peeling step acts not only on an interface between the substrate and the resin having an ether bond but also on the ether bond in a resin molecule, and thus it is possible to cleave the ether bond to dissolve the resin.

A temperature at which the peeling treatment in the peeling step is performed can be any temperature as long as a part or all of the resin having an ether bond can be peeled off from the substrate, and the temperature can be appropriately adjusted in consideration of a type, chemical resistance, an amount, a site, and a type of a functional group of the resin, resin characteristics, and the like. This temperature is preferably 20° C. or higher and 400° C. or lower, more preferably 50° C. or higher and 400° C. or lower, even more preferably 50° C. or higher and 350° C. or lower, and particularly preferably 50° C. or higher and 250° C. or lower, from the perspective of the removal efficiency of the resin having an ether bond, and most preferably 50° C. or higher and 150° C. or lower from the perspective of safety in handling.

A period of time for performing the peeling treatment in the peeling step can be any period of time as long as a part or all of the resin having an ether bond can be peeled off and removed from the substrate, and the period of time can be appropriately adjusted in consideration of a type, chemical resistance, an amount, a site, and a type of a functional group of the resin contained in the semiconductor element, resin characteristics, types of a peeling agent, a solvent, and the treatment liquid, and the like. This period of time is preferably 0.1 minutes or more and 100 hours or less, more preferably 0.1 minutes or more and 50 hours or less, and even more preferably 0.1 minutes or more and 20 hours or less, from the perspective of the removal efficiency of the resin having an ether bond, and most preferably 0.1 minutes or more and 15 hours or less from the perspective of economic efficiency.

An atmosphere in which the peeling treatment in the peeling step is performed is not particularly limited, and can be in the air or in an inert gas such as nitrogen or argon. The peeling treatment can be performed under normal pressure, reduced pressure, or increased pressure. From the perspective of safety during the treatment, the treatment is preferably carried out under normal pressure.

A method for using the treatment liquid in the peeling step is not particularly limited, and the peeling step can be performed by immersing an object in the treatment liquid, or can be performed by spraying the treatment liquid onto the object using a single wafer processing cleaner, a spray, or the like. Alternatively, for example, in a case where the treatment is carried out at a high temperature, a condenser or the like can be attached during the treatment or the treatment can be carried out under reflux to prevent volatilization of the treatment liquid.

(Step of Swelling Resin Having Ether Bond)

In the peeling step, for the purpose of promoting peeling of the resin having an ether bond from the substrate, a step of immersing the resin having an ether bond in a heated organic solvent to cause a volume change of the resin having an ether bond (hereinafter also referred to as a swelling step) can be introduced as pretreatment or intermediate treatment of the peeling step. When such a swelling step is provided, an adhesive force between the resin having an ether bond and the substrate can be reduced to increase an efficiency of peeling the resin having an ether bond from the substrate, which can reduce a time required for production and perform peeling from the substrate under a more relaxed condition.

As the organic solvent used in the swelling step, it is preferable to use a polar solvent because a polar solvent such as water is used in subsequent treatment such as peeling treatment. The solvent can be a single type, or multiple types of solvents can be used. Examples of these polar solvents include polar solvents such as water, alcohols, ketones, nitriles, ethers, esters, carboxylic acids, sulfur-containing compounds, and nitrogen-containing compounds.

Examples of alcohol polar solvents include methanol, ethanol, 1-propanol, 2-propanol, 1-butanol, 2-butanol, 1-pentanol, 2-pentanol, 1-hexanol, 2-hexanol, 3-hexanol, 2-methyl-1-pentanol, 1-heptanol, 2-heptanol, 3-heptanol, dodecanol, cyclohexanol, 1-methylcyclohexanol, phenol, m-cresol, benzyl alcohol, phenoxyethanol, salicyl alcohol, anisyl alcohol, anise alcohol, phenethyl alcohol, 2-methylphenethyl alcohol, 4-methylphenethyl alcohol, 2-methylbenzyl alcohol, 4-methylbenzyl alcohol, 2-ethylbenzyl alcohol, 4-ethylbenzyl alcohol, 2-methoxyphenethyl alcohol, 4-methoxybenzyl alcohol, 4-ethoxybenzyl alcohol, vanillyl alcohol, veratryl alcohol, cinnamyl alcohol, benzhydrol, trityl alcohol, ethylene glycol, ethylene glycol monomethyl ether, ethylene glycol monoethyl ether, diethylene glycol, diethylene glycol monomethyl ether, diethylene glycol monoethyl ether, propylene glycol, triethylene glycol, 1,2-propanediol, 1,3-propanediol, 1,2-butanediol, 1,3-butanediol, 1,5-pentanediol, and glycerin.

Examples of ketone polar solvents include acetone.

Examples of nitrile polar solvents include acetonitrile and propanenitrile.

Examples of ether polar solvents include tetrahydrofuran.

Examples of ester polar solvents include methyl acetate, ethyl acetate, and propylene carbonate.

Examples of carboxylic acid polar solvents include formic acid and acetic acid.

Examples of polar solvents of sulfur-containing compounds include dimethyl sulfoxide, dimethyl sulfone, and sulfolane.

Examples of polar solvents of nitrogen-containing compounds include N,N,N',N'-tetramethylurea, N,N-dimethylformamide, N,N-dimethylacetamide, N-methylformamide, N-methylacetamide, N-methyl-2-pyrrolidone, acetamide, and nitromethane.

Among these solvents, 1-pentanol, 1-hexanol, phenol, cresol, benzyl alcohol, salicyl alcohol, anisyl alcohol, anise alcohol, phenethyl alcohol, vanillyl alcohol, veratryl alcohol, cinnamyl alcohol, benzhydrol, trityl alcohol, ethylene glycol, propylene glycol, diethylene glycol, butanediol, glycerin, dimethyl sulfoxide, dimethyl sulfone, sulfolane, N,N-dimethylformamide, N,N-dimethylacetamide, or N-methyl-2-pyrrolidone is preferable because they have high boiling points and can swell at a high temperature.

In addition, phenol, cresol, benzyl alcohol, anise alcohol, ethylene glycol, propylene glycol, glycerin, dimethyl sulfoxide, sulfolane, N,N-dimethylformamide, N,N-dimethylacetamide, or N-methyl-2-pyrrolidone is more preferable from the perspective that a low-cost and high-purity product is easily available.

Further, benzyl alcohol, ethylene glycol, glycerin, dimethyl sulfoxide, or N-methyl-2-pyrrolidone is even more preferable from the perspective that a high purity product for semiconductors is easily available.

Furthermore, dimethyl sulfoxide is most preferable because it promotes the peeling of the resin having an ether bond from the substrate.

A temperature of the swelling treatment in a case where the swelling step is included can be any temperature as long as the adhesive force between the resin having an ether bond and the substrate can be reduced, and the temperature can be appropriately adjusted in consideration of a type, chemical resistance, an amount, a site, and a type of a functional group of the resin included in the semiconductor element, resin characteristics such as a glass transition temperature of the resin, a type of the organic solvent, and the like. This temperature is preferably 20° C. or higher and 400° C. or lower, more preferably 20° C. or higher and 300° C. or lower, and even more preferably 50° C. or higher and 250° C. or lower, from the perspective of the removal efficiency of the resin having an ether bond, and most preferably 50° C. or higher and 200° C. or lower from the perspective of safety in handling. When the temperature is within the above range, it is possible to reduce the adhesive force between the resin having an ether bond and the substrate to remove the resin having an ether bond efficiently in the subsequent peeling step.

(Object to be Treated, Substrate)

An object to be treated by the treatment liquid is the resin having an ether bond attached to the substrate. The resin having an ether bond can be attached to the substrate via a chemical bond or a physical bond, or can be attached to the substrate with an adhesive layer or the like interposed there between. A part or all of the resin having an ether bond is a treatment target. Examples of the substrate include Si (silicon), a Si compound, ceramic, arsenic, phosphorus, a metal, and a metal compound, and Si or a Si compound is particularly preferable as a semiconductor substrate.

The Si compound is not particularly limited, and examples thereof include silicon oxide, silicon dioxide, glass silica, quartz, crystal, silicon carbide, silicon nitride, mica, clay, and calcium silicate. Examples of the metal include, but are not limited to, aluminum, gallium, chromium, cobalt, nickel, zinc, platinum, germanium, tantalum, and samarium. Examples of the metal compound include, but are not limited to, alumina, zirconia, ferrite, titania, magnesia, and aluminum hydroxide.

(Resin Having Ether Bond)

Examples of the resin having an ether bond include, but are not limited to, polyoxymethylene, polyphenylene ether, a polyurethane resin, a cyanate resin, a phenol resin, a cresol resin, a xylenol resin, a p-t-butylphenol resin, a p-phenylphenol resin, a resorcinol resin, an epoxy resin, polyetherimide, polyether sulfone, polythioether sulfone, polyether ketone, polyether ether ketone, polyether ketone ketone, polyallyl ether ketone, polyether nitrile, and ethyl cellulose. Among them, a polyurethane resin, a phenol resin, a cresol resin, or an epoxy resin is preferable because of chemical resistance, moisture resistance, thermostability, and suitability for use in semiconductor applications, and an epoxy resin is most preferable because of chemical resistance, moisture resistance, thermostability, and the like.

Hereinafter, a case where an epoxy resin is used as the resin having an ether bond will be specifically described as an example.

(Epoxy Resin)

The epoxy resin can be produced by reacting an epoxy resin before curing with a curing agent therefor, and in addition thereto, a crosslinking agent, a curing accelerator, a catalyst, an elastomer, a flame retardant, or the like can be added. Examples of the epoxy resin before curing include, but are not particularly limited to, bisphenol A type epoxy resin, bisphenol F type epoxy resin, bisphenol S type epoxy resin, bisphenol AD type epoxy resin, brominated bisphenol A type epoxy resin, novolac glycidyl ether, polyglycidyl ether of polyhydric alcohol, polyglycidyl ether of polybasic acid, and cresol novolac epoxy resin. Epoxy resins are excellent in terms of, for example, electrical properties, adhesiveness, chemical resistance, and the like.

(Curing Agent)

Examples of the curing agent include, but are not particularly limited to, an acid anhydride, an amine compound, a phenol compound, an isocyanate compound, an organophosphorus compound, a latent curing agent, a cationic polymerization curing agent, an anionic polymerization curing agent, and a metal organic derivative.

Examples of the acid anhydride include phthalic anhydride, succinic anhydride, maleic anhydride, trimellitic anhydride, and nadic anhydride.

Examples of the amine compound include hexamethylenetetramine, polyamidoamine, diaminodiphenylmethane, diaminodiphenylsulfone, and metaphenylenediamine.

Examples of the phenol compound include hydroquinone, resorcinol, catechol, bisphenol A type novolac, bisphenol F type novolac, naphthalenediol, phenol aralkyl, biphenol type novolac, and phenol novolac, and halides, alkyl group substitution products, or polycondensates thereof.

Examples of the organic phosphorus compound include hexamethylphosphoric acid triamide and triphenylphosphine.

Examples of the latent curing agent include dicyandiamide and ketimine.

Examples of the cationic polymerization type curing agent include a boron trifluoride-amine complex.

Examples of the anionic polymerization curing agent include 2-ethyl-4-methylimidazole.

Examples of the metal organic derivative include zinc naphthenate and zinc stearate.

These curing agents can be used singly or in combination of two or more kinds thereof.

Examples of the curing accelerator in the present invention include an imidazole compound, a tertiary amine compound, a quaternary ammonium salt, and an organophosphorus compound. The curing accelerator can be used singly or in combination of two or more kinds thereof (Additives)

The epoxy resin can contain various additives for the purpose of improving resin characteristics of the epoxy resin. Examples of the additive to be used include an inorganic filler, an emulsifier, a foaming agent, a stabilizer, a plasticizer, a lubricant, a flame retardant aid, an antistatic agent, a colorant, a charging agent, and a reactive diluent.

Examples of the inorganic filler include, but are not particularly limited to, a carbonate, a sulfate, a silicon compound, a titanate compound, a boron compound, a hydroxide, an oxide, a nitride, and a carbon-based filler.

Examples of the carbonate include calcium carbonate and magnesium carbonate.

Examples of the sulfate include barium sulfate and calcium sulfate.

Examples of the silicon compound include talc, mica, kaolin clay, wollastonite, sepiolite, hydrotalcite, montmorillonite, glass, silica, clay, and isinglass.

Examples of the titanate compound include potassium titanate.

Examples of the boron compound include aluminum borate.

Examples of the hydroxide include aluminum hydroxide, magnesium hydroxide, and calcium hydroxide.

Examples of the oxide include titanium oxide, zinc oxide, aluminum oxide, and magnesium oxide.

Examples of the nitride include boron nitride and aluminum nitride.

Examples of the carbon-based filler include carbon black, graphite, and carbon fiber.

A size of the resin having an ether bond, which is the object to be treated, is not particularly limited and can be any size as long as the resin can be treated in accordance with a scale of a treatment apparatus or a semiconductor element.

EXAMPLES

The present invention will be described more specifically below by examples, but the present invention is not limited to these examples.

(Substrate Including Resin Having an Ether Bond)

A bisphenol A type epoxy resin ("jER (registered tradename) 1001" available from Mitsubishi Chemical Corporation) was used as the resin having an ether bond, a phenol compound ("jER Cure (registered tradename) 170" available from Mitsubishi Chemical Corporation) was used as the curing agent, and imidazole was used as the curing accelerator, and these were mixed to prepare an epoxy resin composition. At this time, a blending ratio between the epoxy resin and the curing agent was adjusted to have a relationship of epoxy equivalent/hydroxyl equivalent=1, and a blending ratio between the curing agent and the curing accelerator was adjusted to have a relationship of (curing agent/curing accelerator)=(100/1) in terms of mass ratio.

Next, a silicon wafer was impregnated with the produced epoxy resin composition and curing was performed by heating at 150° C. for 30 minutes in a dryer to produce a substrate including an epoxy resin having a thickness of about 0.5 to 1.0 mm. The resulting substrate was cut to produce test pieces each having a size of 10 mm×20 mm.

(Evaluation of Water Concentration)

The concentration of water in the heated solution was evaluated using a water content measuring device (available from Mitsubishi Chemical Analytech Co., Ltd., CA-200) under the following conditions.

Measurement method: Karl Fischer titration volumetric method

Titrant: Aquamicron SS-Z 3 mg (available from Mitsubishi Chemical Corporation)

Dehydrating solvent: Aquamicron GEX (available from Mitsubishi Chemical Corporation)

Sample amount: about 50 mg (Evaluation of Peeling Rate)

Each of the produced test pieces was immersed in a treatment liquid for a predetermined period of time shown in Table 1, and an amount of peeling before and after the immersion was evaluated by the following method.

The epoxy resin on the Si substrate was observed using a digital microscope (available from Keyence Corporation, VHX-8000), and a difference in the thickness of the epoxy resin before and after the immersion in the treatment liquid was calculated to evaluate an amount of peeling.

The peeling rate [μm/min] was evaluated by dividing the peeling amount by the treatment time. Note that the peeling rate in a case where there is no change in the thickness before and after the treatment is 0 μm/min.

(Evaluation of Smoothness of Si Substrate by Treatment Liquid)

Each of the produced test pieces was immersed in a treatment liquid for a predetermined period of time shown in Table 1, and then smoothness of the Si substrate was evaluated as follows.

The surface of the Si substrate was observed with a field emission scanning electron microscope (JSM-7800F Prime, available from JEOL Ltd.), the presence or absence of roughening of the surface was observed and evaluated by the following criteria. An evaluation A is an acceptable level, and evaluations B and C are unacceptable levels.

A: No roughening of the surface is observed.

B: Roughening of the surface is observed.

C: Roughening of the surface is observed, and a change in surface area of the Si substrate is observed as compared with that before immersion.

The fact that no roughening of the surface of the Si substrate is observed and the change of the Si substrate is small indicates that the corrosion of Si is small.

Examples 1 to 14

A rotor (available from AS ONE Corporation, 30 mm in total length×8 mm in diameter) was placed in a three-necked flask, a thermometer protecting tube (available from Cosmos Bead Co., Ltd., bottom-sealed type) and a thermometer were placed in one opening, a PFA tube (available from FLON INDUSTORY, F-8011-02) connected to a nitrogen gas cylinder was connected to another opening, and a PFA tube (available from FLON INDUSTORY, F-8011-02) connected to an Erlenmeyer flask was connected to the remaining one opening.

A phosphoric acid-containing solution (85 mass %; the remaining 15 mass % was water, phosphoric acid available from FUJIFILM Wako Pure Chemical Corporation) was added to the three-necked flask, the temperature was raised to the temperature described in the heating step in Table 1, and the temperature was maintained for the period of time described in the heating step to produce a heated solution.

Thereafter, the heated solution was cooled to the temperature described in the cooling step over the time described in the cooling step in Table 1 to produce a cooled solution, and then an aqueous hydrogen peroxide solution (30 mass %; the remaining 70 mass % was water, available from FUJIFILM Wako Pure Chemical Corporation) was added thereto to have the concentration described in the hydrogen peroxide concentration of the treatment liquid in Table 1 to produce a treatment liquid. The water concentration in Table 1 is the concentration of water in the heated solution, and was evaluated by the above-described Evaluation of Water Concentration.

A rotor (available from AS ONE Corporation, 30 mm in total length×8 mm in diameter) was placed in another three-necked flask, a thermometer protecting tube (available from Cosmos Bead Co., Ltd., bottom-sealed type) and a thermometer were placed in one opening, a PFA tube (available from FLON INDUSTORY, F-8011-02) connected to a nitrogen gas cylinder was connected to another opening, and the remaining one opening was connected to a Dimroth condenser (available from AS ONE Corporation, model No. 4-421-04).

The treatment liquid was added to the three-necked flask, the temperature was raised to the temperature described in the peeling step in Table 1, and then, the test piece was put into the three-necked flask and immersed for the period of time described in the peeling step in Table 1. Thereafter, in Examples 1 to 9 and Examples 13 to 14, the container was naturally cooled to 100° C. and then the test piece was taken out. In Examples 10 to 12, the test piece was taken out without cooling the container. Thereafter, the peeling rate was evaluated by the method described in the above Evaluation of Peeling Rate, the smoothness of the Si substrate was evaluated by the method described in the above Evaluation of Smoothness of Si Substrate by Treatment Liquid, and the results are shown in Table 1.

Example 15

In the same manner as in Examples 1 to 14, phosphoric acid (85 mass %; the remaining 15 mass % was water, available from FUJIFILM Wako Pure Chemical Corporation) was added to a three-necked flask, and except that water was added in such a manner that the concentration of phosphoric acid was 50 mass % to produce a phosphoric acid-containing solution, the peeling rate was evaluated by the method described in the above Evaluation of Peeling Rate under the conditions described in Table 1, the Si smoothness was evaluated by the method described in the above Evaluation of Smoothness of Si Substrate by Treatment Liquid in the same manner as in Examples 1 to 14, and the results are shown in Table 1.

TABLE 1

| | Phosphoric | Heating step | | | Cooling step | | Concentration in treatment |
| | acid | | | | | | liquid (mass %) |
| | concentration | Temperature | Period of time | Water concentration | Temperature | Period of time | Phosphoric |
| Examples | (mass %) | (° C.) | (min) | (mass %) | (° C.) | (min) | acid |
|---|---|---|---|---|---|---|---|
| Example 1 | 85.0 | 180 | 30 | 3.0 | 60 | 30 | 87.3 |
| Example 2 | 85.0 | 180 | 20 | 4.8 | 60 | 30 | 85.7 |
| Example 3 | 85.0 | 180 | 30 | 3.1 | 60 | 30 | 77.5 |
| Example 4 | 85.0 | 180 | 30 | 2.9 | 60 | 30 | 72.8 |
| Example 5 | 85.0 | 120 | 30 | 9.9 | 60 | 15 | 81.1 |
| Example 6 | 85.0 | 150 | 30 | 5.2 | 60 | 22 | 85.3 |
| Example 7 | 85.0 | 230 | 30 | 2.3 | 60 | 45 | 87.9 |
| Example 8 | 85.0 | 180 | 30 | 3.1 | 25 | 45 | 87.2 |

US 12,577,465 B2

23  24

TABLE 1-continued

| Example 9 | 85.0 | 180 | 30 | 3.2 | 60 | 30 | 87.1 |
|---|---|---|---|---|---|---|---|
| Example 10 | 85.0 | 180 | 30 | 3.0 | 60 | 30 | 87.3 |
| Example 11 | 85.0 | 180 | 30 | 2.9 | 60 | 30 | 87.4 |
| Example 12 | 85.0 | 180 | 30 | 3.1 | 25 | 45 | 87.2 |
| Example 13 | 85.0 | 180 | 30 | 3.2 | 60 | 30 | 87.1 |
| Example 14 | 85.0 | 180 | 30 | 3.0 | 60 | 30 | 87.3 |
| Example 15 | 50.0 | 180 | 30 | 8.0 | 60 | 30 | 82.8 |

| | Concentration in treatment liquid (mass %) | | Peeling step | | Results | |
|---|---|---|---|---|---|---|
| | | | | Period | Si | Peeling |
| Examples | Water | Hydrogen peroxide | Temperature (° C.) | of time (min) | substrate Smoothness | rate (μm/min) |
| Example 1 | 9.7 | 3.0 | 150 | 30 | A | 11.2 |
| Example 2 | 11.3 | 3.0 | 150 | 30 | A | 10.8 |
| Example 3 | 16.5 | 6.0 | 150 | 30 | A | 13.7 |
| Example 4 | 19.7 | 7.5 | 150 | 30 | A | 13.5 |
| Example 5 | 15.9 | 3.0 | 150 | 30 | A | 8.6 |
| Example 6 | 11.7 | 3.0 | 150 | 30 | A | 10.6 |
| Example 7 | 9.1 | 3.0 | 150 | 30 | A | 12.0 |
| Example 8 | 9.8 | 3.0 | 150 | 30 | A | 11.3 |
| Example 9 | 9.9 | 3.0 | 120 | 30 | A | 8.2 |
| Example 10 | 9.7 | 3.0 | 100 | 30 | A | 5.0 |
| Example 11 | 9.6 | 3.0 | 75 | 30 | A | 3.0 |
| Example 12 | 9.8 | 3.0 | 50 | 30 | A | 2.0 |
| Example 13 | 9.9 | 3.0 | 200 | 30 | A | 14.0 |
| Example 14 | 9.7 | 3.0 | 250 | 30 | A | 15.8 |
| Example 15 | 14.2 | 3.0 | 150 | 30 | A | 9.0 |

Examples 16 to 23

The treatment liquids of Examples 16 to 23 were provided by producing a cooled solution in the same manner as in Examples 1 to 14, and then adding an aqueous nitric acid solution (70 mass %; the remaining 30 mass % was water, nitric acid available from FUJIFILM Wako Pure Chemical Corporation) to have a nitric acid concentration in the treatment liquid of the concentrations described in Table 2. For the treatment liquids, in the same manner as in Examples 1 to 14, under the conditions described in Table 2, the peeling rate was evaluated by the method described in the above Evaluation of Peeling Rate, the Si smoothness was evaluated by the method described in the above Evaluation of Smoothness of Si Substrate by Treatment Liquid, and the results are shown Table 2.

TABLE 2

| | Phosphoric acid concentration (mass %) | Heating step | | | Cooling step | | Concentration in treatment liquid (mass %) Phosphoric acid |
|---|---|---|---|---|---|---|---|
| Examples | | Temperature (° C.) | Period of time (min) | Water concentration (mass %) | Temperature (° C.) | Period of time (min) | |
| Example 16 | 85.0 | 180 | 30 | 3.0 | 60 | 30 | 95.0 |
| Example 17 | 85.0 | 180 | 30 | 3.1 | 60 | 30 | 92.7 |
| Example 18 | 85.0 | 180 | 30 | 2.9 | 60 | 30 | 90.8 |
| Example 19 | 85.0 | 180 | 30 | 3.1 | 60 | 30 | 87.2 |
| Example 20 | 85.0 | 180 | 30 | 3.0 | 60 | 30 | 90.8 |
| Example 21 | 85.0 | 180 | 30 | 3.2 | 60 | 30 | 90.6 |
| Example 22 | 85.0 | 180 | 30 | 3.0 | 60 | 30 | 90.8 |
| Example 23 | 85.0 | 180 | 30 | 2.9 | 60 | 30 | 90.8 |

| | Concentration in treatment liquid (mass %) | | Peeling step | | Results | |
|---|---|---|---|---|---|---|
| | | | | Period | Si | Peeling |
| Examples | Water | Nitric acid | Temperature (° C.) | of time (min) | substrate Smoothness | rate (μm/min) |
| Example 16 | 3.6 | 1.4 | 150 | 30 | A | 11.0 |
| Example 17 | 4.3 | 3.0 | 150 | 30 | A | 11.2 |
| Example 18 | 4.7 | 4.5 | 150 | 30 | A | 11.6 |
| Example 19 | 5.8 | 7.0 | 150 | 30 | A | 11.0 |
| Example 20 | 4.7 | 4.5 | 120 | 30 | A | 9.0 |
| Example 21 | 4.9 | 4.5 | 100 | 30 | A | 6.3 |
| Example 22 | 4.7 | 4.5 | 75 | 30 | A | 4.9 |
| Example 23 | 4.7 | 4.5 | 50 | 30 | A | 3.0 |

Comparative Examples 1 to 6

In Comparative Examples 1 to 6, a mixture of raw materials having the composition shown in Table 3 was produced at 25° C., the peeling rate was evaluated by the method described in the above Evaluation of Peeling Rate under the conditions shown in Table 3, the smoothness of the Si substrate was evaluated by the method described in the above Evaluation of Smoothness of Si Substrate by Treatment Liquid, and the results are shown in Table 3. Note that in Comparative Example 1, aqueous hydrogen peroxide solution (30 mass %; the remaining 70 mass % was water, available from FUJIFILM Wako Pure Chemical Corporation) was used; in Comparative Example 2, phosphoric acid (85 mass %; the remaining 15 mass % was water, available from FUJIFILM Wako Pure Chemical Corporation) and N-methylpyrrolidone (available from FUJIFILM Wako Pure Chemical Corporation) were used; in Comparative Example 3, benzyl alcohol (available from FUJIFILM Wako Pure Chemical Corporation) and potassium phosphate (available from FUJIFILM Wako Pure Chemical Corporation) were used; and in Comparative Example 4, potassium hydroxide (available from FUJIFILM Wako Pure Chemical Corporation) and N-methylpyrrolidone (available from FUJIFILM Wako Pure Chemical Corporation) were used. In Comparative Example 5, phosphoric acid (85 mass %; the remaining 15 mass % was water, available from FUJIFILM Wako Pure Chemical Corporation) was used. In Comparative Example 6, nitric acid (70 mass %; the remaining 30 mass % was water, available from FUJIFILM Wako Pure Chemical Corporation) was used.

TABLE 3

| Comparative Examples | Treatment Liquid Composition | | | | Peeling step | | Results | |
| | Composition (Type) | Concentration (mass %) | Solvent (Type) | Solvent Concentration (mass %) | Temperature (° C.) | Period of time (min) | Si substrate Smoothness | Peeling rate (μm/min) |
|---|---|---|---|---|---|---|---|---|
| Comparative Example 1 | H₂O₂ | 30.0 | Water | 70.0 | 90 | 30 | A | 0 |
| Comparative Example 2 | Phosphoric acid | 10.0 | NMP, Water | 90.0 | 100 | 30 | A | 0.2 |
| Comparative Example 3 | K₃PO₄ | 7.6 | BZA | 92.4 | 150 | 30 | B | 0.1 |
| Comparative Example 4 | KOH | 3.0 | NMP | 97.0 | 150 | 30 | C | 0.1 |
| Comparative Example 5 | Phosphoric acid | 85.0 | Water | 15.0 | 25 | 30 | A | 0 |
| Comparative Example 6 | Nitric acid | 70.0 | Water | 30.0 | 60 | 30 | A | 0.1 |

* NMP: N-methylpyrrolidone
* BZA: benzyl alcohol

From Tables 1 to 3, it was found that when the treatment liquid produced by the production method according to the present embodiment was used, in removing the resin having an ether bond from the substrate, it was possible to suppress corrosion of Si of the substrate and to ensure a high peeling rate.

What is claimed is:
1. A method for producing a semiconductor treatment liquid used for treating a resin having an ether bond, the method comprising:
    heating a phosphoric acid-containing solution to 100° C. or higher and 400° C. or lower to produce a heated solution;
    cooling the heated solution to 5° C. or higher and 95° C. or lower to produce a cooled solution; and
    mixing the cooled solution with at least one selected from the group consisting of an aqueous hydrogen peroxide solution and an aqueous nitric acid solution.

2. The method for producing a semiconductor treatment liquid according to claim 1, wherein a concentration of phosphoric acid in the phosphoric acid-containing solution is 0.1 mass % or greater and 95 mass % or less.

3. The method for producing a semiconductor treatment liquid according to claim 1, wherein the heated solution contains pyrophosphoric acid.

4. The method for producing a semiconductor treatment liquid according to claim 1, wherein a concentration of water in the heated solution is 0 mass % or greater and 20 mass % or less.

5. The method for producing a semiconductor treatment liquid according to claim 1, wherein the resin having an ether bond is an epoxy resin.

6. The method for producing a semiconductor treatment liquid according to claim 1, wherein a concentration of hydrogen peroxide in the aqueous hydrogen peroxide solution is 0.001 mass % or greater and 90 mass % or less.

7. The method for producing a semiconductor treatment liquid according to claim 1, wherein a concentration of nitric acid in the aqueous nitric acid solution is 0.001 mass % or greater and 90 mass % or less.

8. A method for producing a semiconductor element, the method comprising peeling a resin having an ether bond from a semiconductor substrate by using the semiconductor treatment liquid produced by the method for producing a semiconductor treatment liquid according to claim 1, wherein the peeling is performed at 20° C. or higher and 400° C. or lower.

\* \* \* \* \*